United States Patent [19]

Carpenter, Jr. et al.

[11] Patent Number: 5,266,444
[45] Date of Patent: Nov. 30, 1993

[54] METHOD AND COMPOSITION FOR OBTAINING IMAGE REVERSAL IN EPOXY FORMULATIONS BASED UPON PHOTOINHIBITION

[75] Inventors: Burton J. Carpenter, Jr.; Joseph LaTorre; Michael G. McMaster, all of Austin, Tex.; Logan L. Simpson, Binghamton, N.Y.

[73] Assignee: International Business Machines Corporation, Armonk, N.Y.

[21] Appl. No.: 943,075

[22] Filed: Sep. 10, 1992

[51] Int. Cl.$^5$ ............................................. C03C 1/725
[52] U.S. Cl. .................................... 430/280; 430/326; 430/917
[58] Field of Search ......................... 430/280, 326, 917

[56] References Cited

U.S. PATENT DOCUMENTS

| | | | |
|---|---|---|---|
| 4,054,451 | 10/1977 | Schlesinger et al. | 430/280 |
| 4,216,288 | 8/1980 | Crivello | 430/280 |
| 4,299,911 | 11/1981 | Ochi et al. | 430/286 |
| 4,439,517 | 3/1984 | Irving | 430/328 |

OTHER PUBLICATIONS

British Patent Specification 1 330 100.
Abstract of European Patent 0 295 211.
Abstract of European Patent 3 108 881.

Primary Examiner—John Kight, III
Assistant Examiner—T. Mosley
Attorney, Agent, or Firm—Charles D. Gunter, Jr.; Andrew J. Dillon

[57] ABSTRACT

A method and composition are shown for producing a positive-acting photoimagible epoxy resin. In addition to the epoxy resin, the compositions include a dual component cross-linking system which combines a basic curing agent with an onium or arylonium salt. The onium or arylonium salt produces a protic acid upon exposure to irradiation causing a reaction with the basic curing agent which renders the agent ineffective as an epoxy curing agent during subsequent heating. During a subsequent bake operation, only the unexposed regions of the epoxy will cross-link. As a result, the exposed areas wash away, leaving only the cured reverse image.

8 Claims, No Drawings

METHOD AND COMPOSITION FOR OBTAINING IMAGE REVERSAL IN EPOXY FORMULATIONS BASED UPON PHOTOINHIBITION

BACKGROUND OF THE INVENTION

1. Technical Field

The present invention relates generally to a method for forming images using photoimagible compositions and to substrates bearing an image prepared by such method and, specifically, to a dual component cross-linking system for producing positive-acting photoimagible epoxy resin formulations of the type useful as photoresists.

2. Description of the Related Art

The preparation of images by photopolymerization is well known. A photopolymerizable composition is applied as a coating to a substrate, which may be a resinous laminate bearing a metal on its surface. The coating is irradiated through a negative or other mask, and the unexposed (unpolymerized) portions of the coating are removed by means of a suitable solvent. The substrate may then be etched, removing only those parts of the metal surface which do not bear the photopolymerized coatings. Such image forming techniques are used, for example, in the manufacture of printed circuits.

Where epoxy resins have been utilized as the polymerizable component, they have generally been negative working, whereby the material which is exposed to irradiation cross-links and subsequently becomes unaffected by the developing solvent. Materials that cross-link upon exposure and remain through all of the developing steps are referred to as "negative-working." An example of such a negative working epoxy-photoresist system is shown, for example, in U.S. Pat. No. 4,439,517, issued Mar. 27, 1984, to Irving, entitled "Process For The Formation of Images With Epoxide Resin."

The present invention has as its object to provide a positive-acting, photoimagible epoxy resin system. Such a resin system would be of advantage whenever the application required a photoimagible polymer which would cure in the unexposed areas; for instance where it is impossible or impractical to provide light to the areas to be cured.

SUMMARY OF THE INVENTION

The present invention provides a method and composition for forming a positive image on a substrate, the method comprising the steps of:

exposing image-wise to radiation a layer of a photoresist composition on the substrate, the photoresist composition comprising:
    epoxy resin system;
    a basic curing compound containing thermal curatives, the basic curing compound being present in an amount effective to normally cure the epoxy resin system upon heating;
    a photoinhibitor compound capable of producing a protic acid upon exposure to radiation, the photoinhibitor compound being present in an amount effective to produce sufficient protic acid upon exposure to radiation to react with the basic curing compound in the exposed areas in an acid-base manner to thereby render it ineffective as an epoxy curing agent;
  heating the composition on the substrate such that those parts of the composition which have not been struck by the radiation are substantially cured, whereas those parts thereof which have been so struck remain substantially uncured; and then
  treating the composition on the substrate with a solvent developer to remove those parts of the composition which remain substantially uncured.

Preferably, the basic curing compound is selected from the group consisting of aliphatic primary, secondary and tertiary amines, aromatic amines, cycloaliphatic and heterocyclic amines, amides, amido amines, polyamides and polyether amines.

The photoinhibitor compound is preferably selected from the group consisting of those onium and arylonium salts which produce a strong acid upon exposure to radiation.

The above as well as additional objects, features, and advantages of the invention will become apparent in the following detailed description.

DETAILED DESCRIPTION OF THE INVENTION

The term "resin system" as used herein is intended to include those systems containing at least one epoxy resin as the polymerizable component. The preferred epoxy resins include those having at least one group of the formula:

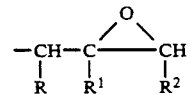

directly attached to an atom of oxygen, where either R and $R^2$ each represents a hydrogen atom, in which case $R^1$ denotes a hydrogen atom or a methyl group, or R and $R^2$ together represent $-CH_2CH_2-$, in which case $R^1$ denotes a hydrogen atom.

As examples of such resins may be mentioned polyglycidyl and poly($\beta$-methylglycidyl) esters obtainable by reaction of a compound containing two or more carboxylic acid groups per molecule with epichlorohydrin, glycerol dichlorohydrin, or $\beta$-methylepichlorohydrin in the presence of an alkali. Such polyglycidyl esters may be derived from aliphatic polycarboxylic acids, e.g., succinic acid, glutaric acid, adipic acid, pimelic acid, suberic acid, azelaic acid, sebacic acid, or dimerised or trimerised linoleic acid; from cycloaliphatic polycarboxylic acids such as tetrahydrophthalic acid, 4-methyltetrahydrophthalic acid, hexahydrophthalic acid, and 4-methylhexahydrophthalic acid; and from aromatic polycarboxylic acids such as phthalic acid, isophthalic acid, and terephthalic acid. Other suitable polygylcidyl esters are obtainable by vinyl polymerization of glycidyl esters of vinylic acids, especially glycidyl acrylate and glycidyl methacrylate.

Further examples are polyglycidyl and poly($\beta$-methylglycidyl)ethers obtainable by reaction of a compound containing at least two free alcoholic hydroxyl groups per molecule with the appropriate epichlorohydrin under alkaline conditions or, alternatively, in the presence of an acidic catalyst and subsequent treatment with alkali. These ethers may be made from acyclic alcohols such as ethylene glycol, diethylene glycol, and higher poly(oxyethylene)glycols, propane-1,2-diol and poly(oxypropylene)glycols, propane-1,3-diol, poly(oxytetramethylene)glycols, pentane-1,5-diol, hexane-2,4,6-triol, glycerol, 1,1,1-trimethylolpropane, pentaerythritol, sorbitol, and polyepichlorohydrins; from cycloaliphatic alcohols such as resorcitol, quinotol, bis(4-hydroxycyclohexyl) methane, 2,2-bis(4-hydroxycyclohexyl) propane, and 1,1-bis(hydroxymethyl)cyclohex-3-ene; and from alcohols having a romatic nuclei, such as N,N-bis (2-hydroxyethyl) aniline and p,p'-bis(2-hydroxyethylamino)diphenylmethane. Or they may be made from mononuclear phenols, such as resorcinol and hydroquinone, and from polynuclear phenols, such as bis(4-hydroxyphenyl)methane, 4,4'-dihydroxydiphenyl, bis (4-hydroxyphenyl) sulphone, 1,1,2,2 -tetrakis(4-hydroxyphenyl) ethane, 2,2-bis(4-hydroxyphenyl) propane, 2,2-bis(3,5-dibromo-4-hydroxyphenyl)-propane, and novolaks formed from aldehydes such as formaldehyde, acetaldehyde, chloral and furfuraldehyde, with phenol itself, and phenol substituted in the ring by chlorine atoms or by alkyl groups containing up to nine carbon atoms, such as 4-chlorophenol, 2-methylphenol, and the like.

Examples of epoxide resins having at least one group of formula I where R and $R^2$ conjointly denote a —$CH_2CH_2$— group are bis(2,3-epoxycyclopentyl)ether, 2,3-epoxycyclopentyl glycidyl ether, and 1,2-bis(2,3-epoxycyclopentyloxy)ethane.

Epoxide resins having the 2-epoxide groups attached to different kinds of oxygen atoms may be employed, e.g., the glycidyl ether-glycidyl ester of salicylic acid.

Epoxide resins in which some or all of the epoxide groups are not terminal may also be employed, such as vinylcyclohexane dioxide, limonene dioxide, dicyclopentadiene dioxide, and the like, and epoxidized butadienes or copolymers of butadienes with ethylenic compounds such as styrene and vinyl acetate.

If desired, a mixture of epoxide resins may be used as the polymerizable component. The resin system may also include traditional accelerators, fillers and various other components familiar to those skilled in the art.

The present method for forming an image on a substrate combines two different, previously diverse curing systems for the epoxy resin system. The first of these previously diverse classes of curing agents for epoxy resins include the basic amide/amine curing agents. This category of curing agents includes, for example, the aliphatic primary, secondary, and tertiary amines, aromatic amines, cycloaliphatic and heterocyclic amines, amides, amido amines, polyamides and polyether amines. This particular class of curing agents for epoxy resins will be familiar to those skilled in the art and includes, for example, methylenedianiline, phenylenediamine, diaminodiphenylsulfone, diethylenetriamine, triethylenetetramine, tetramethylbutane diamine, and the like. For further examples of basic curing agents, see, for example, "The Epoxy Resin Formulators Training Manual", *Society of the Plastic Industry, Inc.*, New York, NY (1984). By properly selecting the basic curing compound or "hardener", from the above described class of curing agents, the epoxy formulator can vary cure parameters, such as time and temperature, as needed to suit the desired function of the material. However, the prior art epoxies cured with these materials alone have not generally been photosensitive.

The present invention also makes use of a second, previously diverse class of curing agents for epoxy resins as a companion for the basic curing compound or compounds. The second class of curing agents have been used in the past to render such resins photosensitive. However, in the context of the present invention, the second class of curing agent is used as a "photo inhibitor."

The preferred second class of curing agents are aromatic compounds which liberate an acid upon exposure to actinic radiation. Preferably, such compounds are selected from the chlorides, bromides and iodides of onium bases of elements in Group VA, VIA or VIIA of the Periodic Table (as shown on page 1-11 in the Handbook of Chemistry and Physics, Lide, Revised 72nd Edition, CRC Press). Included are diazonium, phosphonium, arsonium, oxonium, sulphonium, sulphoxonium, selenonium, telluronium, chloronium, bromonium and iodonium chlorides, bromides, or iodides. Most preferably, the second class of curing compounds are the onium and arylonium salts with complex metal halide anions.

These salts are often employed as thermally stabile photoinitiators for inducing the cationic polymerization of epoxies. See, for example, J. V. Crivello, "UV Curing: Science and Technology", *S. P. Pappas, Ed.*, Technology Marketing Corporation, Stanford, Conn. (1978). Formulators commonly utilize onium and arylonium salts when it is desirable to cure select regions of epoxy, while leaving other regions uncured. That portion of the material which is exposed to irradiation cross-links and subsequently becomes unaffected by the developing solvent. Materials that cross-link upon exposure and remain through the developing steps are referred to as "negative-working." Traditionally, photo-cured epoxy systems to date have functioned in a negative-working tone.

The photoacid generators used in the present invention actually function as "photoinhibitors" since the resulting acid which is produced upon exposure to radiation reacts chemically with the basic curing compound present in the irradiated portion of the substrate to nullify the curing process and render the basic curing agent ineffective as an epoxy curing agent in the subsequent bake operation. The most preferred photoacid generators or photoinhibitors are substituted and unsubstituted onium and arylonium salts. For example, aromatic iodonium salts which can be used in the practice of the invention thus include those having the formulae:

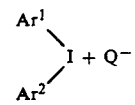

wherein $Ar^1$ and $Ar^2$ are aromatic groups having 4 to 20 carbon atoms and are preferably selected from phenyl, naphthyl, thienyl, and furanyl groups; and Q is any anion, but preferably is an anion selected from tetrafluoroborate, hexafluorophosphate, hexafluoroarsenate, hexafluoroantimonate, trifluoromethane sulfonate or trifluoroacetate.

Amongst the useful iodonium salts are particularly included:
diphenyliodonium hexafluoroarsenate
diphenyliodonium hexafluoroantimonate
diphenyliodonium hexafluorophosphate
diphenyliodonium trifluoroacetate
4-trifluoromethylphenyliodonium tetrafluoroborate
ditolyliodonium hexafluorophosphate
di(4-methoxyphenyl)iodonium hexafluoroantimonate
diphenyliodonium trifluoromethane sulfonate di(t-butylphenyl)iodonium hexafluoroantimonate
di(t-butylphenyl)iodonium trifluoromethane sulfonate
(4-methylphenyl)phenyliodonium tetrafluoroborate
di-(2,4-dimethylphenyl)iodonium hexafluoroantimonate
di-(4-t-butylphenyl)iodonium hexafluoroantimonate
2,2'-diphenyliodonium hexafluorophosphate Among the useful sulphonium salts are included triphenylsulphonium bromide, triphenylsulphonium chloride, triphenylsulphonium iodide, diphenylethylsulphonium chloride and phenylaryldimethylsulphonium chloride.

The present invention provides a method by which photoimagible epoxy resin systems can be exposed and processed in such a manner as to yield an image reversal, thus effectively producing a "positive-working" epoxy system (i.e., the unexposed regions remain after developing). The method of the invention employs a dual component cross-linking system including a photoinhibitor which produces a protic acid upon exposure to irradiation and, as a second component, a basic compound which can be, for example an amide/amine-containing thermal curative component. The photogenerated acid reacts with the amide/amine-containing thermal curative in an "acid-base" manner, rendering it ineffective as an epoxy curing agent. As a result, during the subsequent bake operation, only the unexposed regions of the epoxy resin system will cross-link. When developed, the exposed areas wash away, leaving only the cured "reverse image."

The relative amounts of basic curing agent and photoinhibitor utilized in the resin formulations of the invention will depend upon the particular compounds selected. For example, the amount of onium or arylonium photoinhibitor serving as the source of acid will depend upon the efficiency of the photolytic process, the makeup of the compound and to the amount of actinic energy to which the compound is exposed. Suitable proportions may be readily determined by routine experimentation, but typically from about 5 to 30% photoinhibitor and from about 0.1 to 3% by weight basic curing compound by weight are used based on the weight of resin.

The following epoxy resin systems, amide/amine-containing thermal curatives and onium/arylonium salt photoinhibitors illustrate preferred systems which can be utilized in practicing the method of the invention:

Resin System

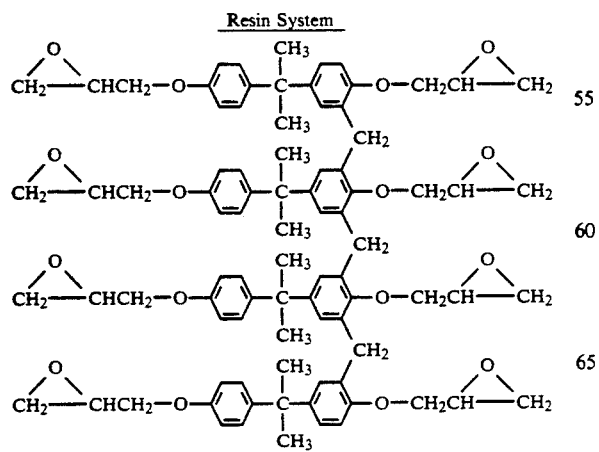

Resin System

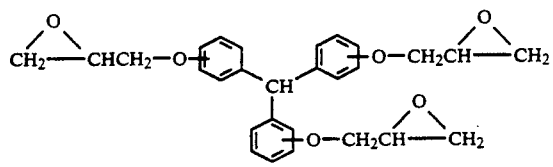

Photoinhibitor

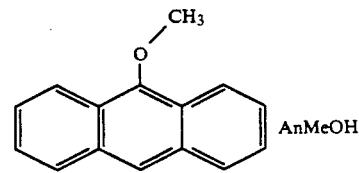

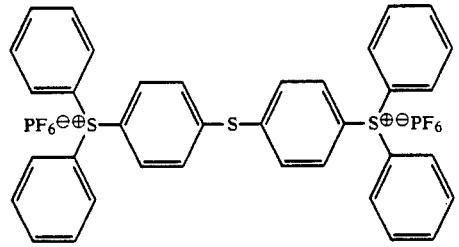

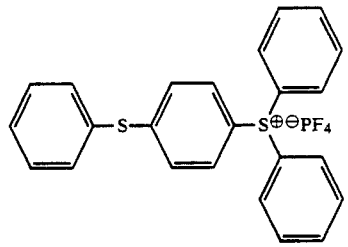

Basic Curing Agent

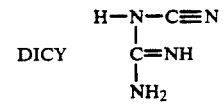

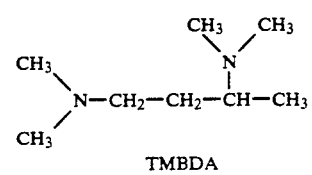

Resin System
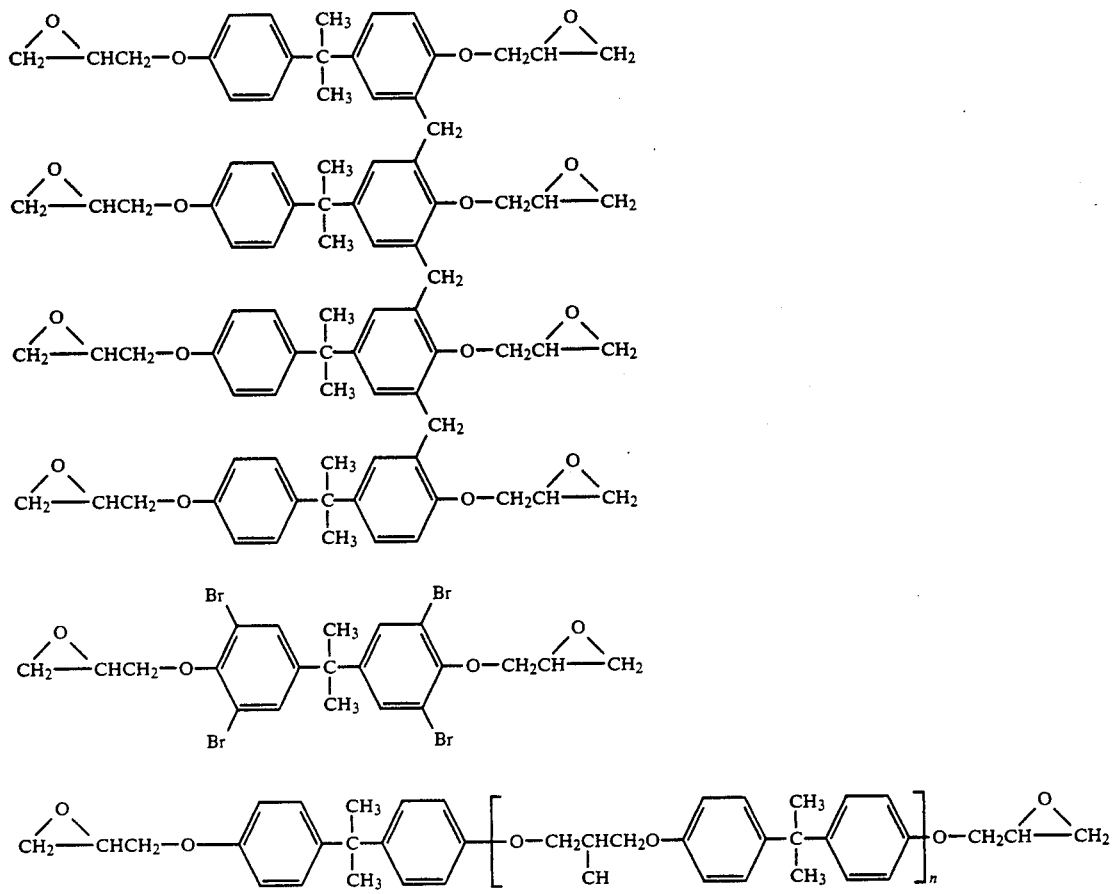
n = 82 ~ 123
Photoinhibitor
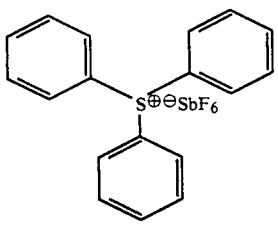
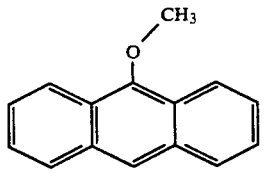
Basic Curing Agent
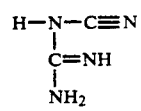
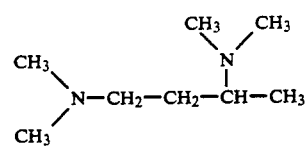
Resin System
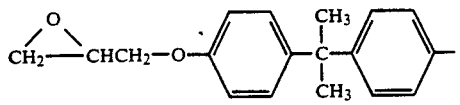

-continued
Resin System

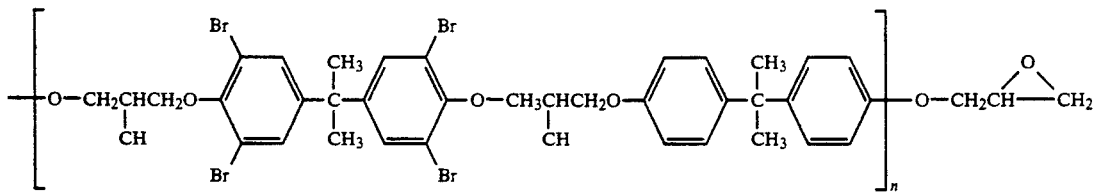

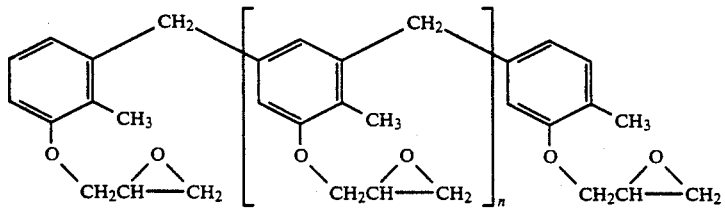

Basic Curing Agent

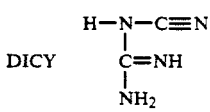
DICY

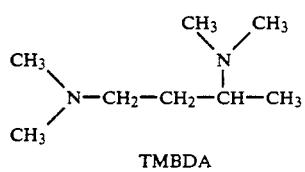
TMBDA

Photoinhibitor

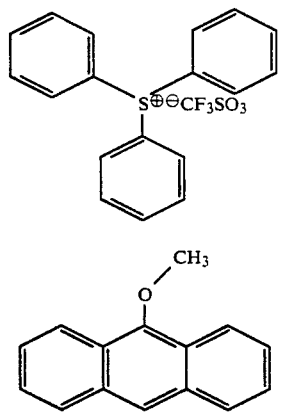

The following non-limiting examples are intended to be illustrative of the invention:

EXAMPLE I

The following materials are combined and mixed to form a "positive-working" epoxy formulation.
17 grams Varnish (Consisting of 8.5 grams of FR4 epoxy resin, 0.25 grams of dicyandiamide and 0.20 grams of tetramethylbutane diamine in a solvent mixture of EGME/MEK).
3 grams of Triarylsulfonium Triflate (photoinhibitor).
1 gram of an thracenemethanol (photosensitizer).

The formulation was coated onto a copper substrate and dried to remove the solvent. The same was then exposed through a photomask with a dose of approximately 2.5 J/cm². A post-expose bake of 15 minutes at 170|C. revealed a strong latent image. The cure epoxy reverse image was developed with spraying in butyrolactone at 20|C./30 psi for 5 minutes.

EXAMPLE II

| | | |
|---|---|---|
| SU-8 Resin[1] | 15 g | ⎫ (50% in THF) |
| XD-7342 Resin[2] | 5 g | ⎭ |
| FX-512[3] | 0.5 g | |
| Anthracenemethanol | 50 mg | |
| Dicyandiamide | 600 mg | |
| TMBDA | 60 mg | |
| FC430[4] | 1 drop | |

[1]SU-8 is a polyepoxy resin commercially available from Rhone-Poulenc of Louisville, Kentucky under the trademark EPIREZ SU-8.
[2]XD-7342 is an epoxidized trishydroxyphenylmethane commercially available from Dow Chemical.
[3]FX512 is a triarylsulfonium hexafluoroantimonate salt commercially available from General Electric Company.
[4]Surfactant commercially available from 3M Corporation under the trademark FLUORAD FC 430.

A copper substrate was coated and dried to remove solvent. The substrate was exposed with a dose of approximately 3.5 J/cm² mid U.V. light. A post expose bake for 30 minutes at 130|C. showed a strong latent image. The cure epoxy reverse image was developed with spraying in butyrolactone.

An invention has been provided with several advantages. The method of the invention allows reverse imaging of epoxy or other base initiated cross-linkable resins. The technique is straightforward and applicable to a variety of formulations to effectively convert them from negative-working to positive-working systems. The protic acid which is produced upon the exposure of the photoinhibitor component to irradiation reacts with a basic, curing agent containing thermal curative in a typical acid-base manner to render it ineffective as an epoxy curing agent. As a result, during the subsequent bake operation, only the unexposed regions of the epoxy resin system will cross-link. When developed, the exposed areas wash away, leaving only the cured "reverse image." A resin system which is reverse imagible is useful whenever the application requires a photoimagible polymer which cures in the unexposed regions. For example, such a resin system would be useful where it is impossible or impractical to provide light to the areas to be cured.

While the invention has been shown in only one of its forms, it is not thus limited but is susceptible to various changes and modifications without departing from the spirit thereof.

What is claimed is:

1. A method for forming a positive image on a substrate, the method comprising the steps of:
    exposing image-wise to radiation a layer of a photoresist composition on the substrate, thee photoresist composition comprising:
        an epoxy resin system;
        a basic curing compound containing thermal curatives, the basic curing compound being present in an amount effective to normally cure the epoxy resin system upon heating;
        a photoinhibitor compound capable of producing a protic acid upon exposure to radiation, the photoinhibitor compound being present in an amount effective to produce sufficient protic acid upon exposure to radiation to react with the curing compound in the exposed areas in an acid-base manner to thereby render it ineffective as an epoxy curing agent;
    heating the composition on the substrate such that those parts of the composition which have not been struck by the radiation are cured, whereas those parts thereof which have been so struck remain uncured; and then
    treating the composition on the substrate with a solvent developer to remove those parts of the composition which remain uncured.

2. A method for forming an image on a substrate, which comprises the steps of:
    exposing image-wise to actinic radiation a layer of a photoresist composition on the substrate, the photoresist composition comprising:
        an epoxy resin system;
        an effective amount of a basic curing compound present in an amount effective to normally cure the epoxy resin system upon heating, the basic curing compound being selected from the group consisting of aliphatic primary, secondary and tertiary amines, aromatic amines, cycloaliphatic and heterocyclic amines, amido amines, polyamides and polyether amines;
        a photoinhibitor, the photoinhibitor being present in an amount effective to produce sufficient protic acid upon exposure to radiation to react with the basic curing compound in the exposed areas in an acid-base manner to thereby render it ineffective as an epoxy curing agent, whereby the exposed areas remain uncured during subsequent heating, the photoinhibitor being selected from the group consisting of onium and arylonium salts;
    heating the composition on the substrate such that the part or parts of the composition which have not been struck by the radiation are cured, whereas the part or parts thereof which have been so struck remain uncured; and then
    treating the composition on the substrate with a solvent developer to remove the part of parts of the composition which remain uncured.

3. The method of claim 2, wherein the photoinhibitor composition is an aromatic compound which liberates an acid upon exposure to actinic radiation, selected from chlorides, bromides, and iodides of onium basis of elements in the group IVA., VIA. or VIIA. of the Periodic Table.

4. The method of claim 3, wherein the photoinhibitor is an arylonium salt complexed with a metal halide anion.

5. A positive acting photoimagible epoxy resin composition, consisting essentially of:
    an epoxy resin system;
    a basic curing compound containing thermal curatives; and
    a photoinhibitor which generates an acid upon exposure to radiation, the photoinhibitor being present in the range from about 5 to 30% by weight, based upon the weight of the epoxy resin system, the photoinhibitor being present in an amount effective to react with the basic curing compound and render it ineffective in curing the epoxy resin upon subsequent heating, whereby portions of the resin which are exposed to radiation remain uncured, while exposed portions of the resin cure during subsequent heating.

6. The composition of claim 5, wherein the basic curing compound is selected from the group consisting of aliphatic primary, secondary and tertiary amines, aromatic amines, cycloaliphatic and heterocyclic amines, amido amines, polyamides and polyether amines.

7. The composition of claim 6, wherein the photoinhibitor composition is an aromatic compound which liberates an acid upon exposure to actinic radiation, selected from chlorides, bromides, and iodides of onium basic of elements in the group IVA., VIA. or VIIA. of the Periodic Table.

8. The composition of claim 7, wherein the photoinhibitor is an arylonium salt complexed with a metal halide anion.

* * * * *